(12) United States Patent
Parson et al.

(10) Patent No.: US 6,215,727 B1
(45) Date of Patent: Apr. 10, 2001

(54) METHOD AND APPARATUS FOR UTILIZING PARALLEL MEMORY IN A SERIAL MEMORY SYSTEM

(75) Inventors: Jerome W. Parson, Forest Grove, OR (US); William M. Vaughn, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/542,633

(22) Filed: Apr. 4, 2000

(51) Int. Cl.[7] .......................................................... G11C 7/00

(52) U.S. Cl. ........................................ 365/233; 365/230.09

(58) Field of Search ............................... 365/233, 230.09, 365/231; 395/309, 200.55

(56) References Cited

U.S. PATENT DOCUMENTS 5,933,614 * 8/1999 Tavallaci et al. ..................... 395/309

* cited by examiner

Primary Examiner—Vu A. Le
(74) Attorney, Agent, or Firm—Blakely, Sokoloff, Taylor & Zafman LLP

(57) ABSTRACT

A method and apparatus providing parallel memory circuitry, such as for example synchronous dynamic random access memory (SDRAM) support in a computer system designed to support serial memory circuitry, such as for example Rambus dynamic random access memory (RDRAM). In one embodiment, a circuit board including a memory translator having serial memory interface logic and parallel memory interface logic is plugged into a serial memory connector on a motherboard designed to utilize serial memory circuitry. The circuit board includes parallel memory circuitry coupled to the parallel memory interface logic of the memory translator. The memory controller on the motherboard accesses the parallel memory circuitry on the circuit board through the memory translator.

27 Claims, 2 Drawing Sheets

METHOD AND APPARATUS FOR UTILIZING PARALLEL MEMORY IN A SERIAL MEMORY SYSTEM

BACKGROUND OF THE INVENTION

1. Field of the Invention

The present invention relates generally to computer systems and, more specifically, the present invention relates to memories in computer systems.

2. Background Information

Computer systems use memory to store data or information. Random access memory (RAM) is a type of memory used by computers to hold data and may be accessed randomly by a computer processor for computer operations. Computer processors use RAM for activities such as the storage of data, calculation results, program instructions, etc. As computer technology continues to advance, computer memory speeds continue to increase.

As computer memory speeds continue to increase, there appears to be a trend of converting from today's standard, but slower, parallel memories to serial memories, which are generally faster than today's parallel memories. Parallel memories include for example single in-line memory modules (SIMMs) or dual in-line memory modules (DIMMs). SIMMs and DIMMs utilize synchronous dynamic RAMs (SDRAMs), which have a typical transfer rate of approximately 800 megabytes per second. However, serial memories, such as for example Rambus® in-line memory modules (RIMMs™), which utilize Rambus dynamic RAMs (RDRAMs®), have a typical transfer rate of around 1.6 gigabytes per second.

Presently, computer manufacturers are migrating over to the use of serial memories, such as for example RIMMs, instead of the use of parallel memories, such as for example DIMMs. However, since serial memories are a relatively new technology, serial memories at this time are not as widely available and are consequently more costly when compared to parallel memories. Indeed, there is presently a relatively large supply of SIMMs and DIMMs compared to the supply of RIMMs.

RIMMs are not compatible with SIMMs or DIMMs. That is, one cannot simply unplug a RIMM from a computer motherboard and replace it with a DIMM. As a result, computer users that have computer systems configured to operate only with RIMMs are unable to utilize the more inexpensive SIMMs or DIMMs. Therefore, until the cost of serial memories comes down, computer systems configured to operate only with serial memories are more expensive than computer systems configured to operate with parallel memories.

BRIEF DESCRIPTION OF THE DRAWINGS

The present invention is illustrated by way of example and not limitation in the accompanying figures.

DETAILED DESCRIPTION

In one aspect of the present invention, methods and apparatuses for utilizing parallel memory circuitry in a computer system configured to support only serial memory circuitry are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

In embodiment, the present invention describes a circuit board that provides parallel SDRAM support in a computer system designed to operate with serial RDRAMs. In one embodiment, the circuit board of the present invention is adapted to be plugged into or engaged with a RIMM connector on a computer system motherboard. In one embodiment, parallel memory circuitry, such as for example DIMMs or SIMMs are utilized in the circuit board of the present invention to provide memory circuitry. In one embodiment, the circuit board of the present invention includes memory translation circuitry to translate the serial signals transmitted to and from a memory controller on the motherboard to parallel signals to be transmitted to and from the parallel SDRAM on the circuit board of the present invention. As a result, in one embodiment, the SDRAM on the circuit board of the present invention appears to the memory controller on the motherboard as RDRAM.

Figure 1:
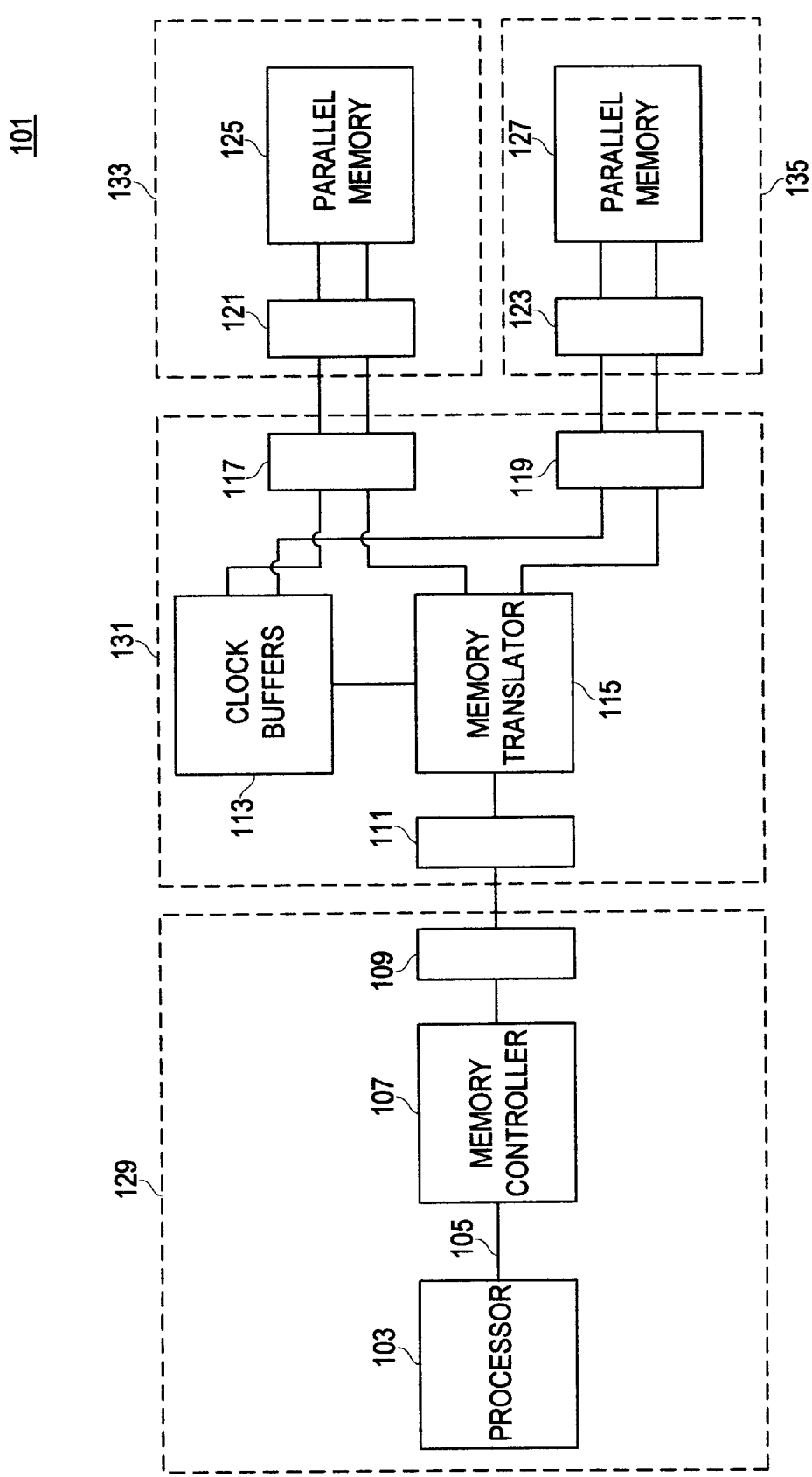
FIG. 1 is block diagram illustrating one embodiment of a computer system configured to operate with serial memory circuitry operating with parallel memory circuitry in accordance with the teachings of the present invention.

To illustrate, FIG. 1 is an illustration of one embodiment of the block diagram showing a computer system 101 in accordance with the teachings of the present invention. In one embodiment, computer system 101 includes a processor 103 coupled to a memory controller 107 through a bus 105. In one embodiment, processor 103, bus 105 and memory controller 107 are on a circuit board 129. In one embodiment, board 129 is a motherboard of computer system 101. In one embodiment, processor 103 is an Intel® Pentium® family computer processor or the like and memory controller is an Intel® 82820 Memory Controller, or the like, which is designed to support serial memory circuitry such as for example RDRAMs. In one embodiment, memory controller 107 includes a Direct Rambus Memory Controller designed to interface directly with RIMMs. It is appreciated that other processors and/or memory controllers, which are designed to support serial memory circuitry such as RDRAMs may be utilized in accordance with the teachings of the present invention.

As shown in FIG. 1, a connector 109 is coupled to memory controller 107. In one embodiment, connector 109 is designed to support serial memory circuitry card such as for example a RIMM. In one embodiment, circuit board 131 of the present invention includes a connector 111 adapted to be engaged with connector 109. As shown in FIG. 1, memory translator 115 on board 131 is coupled to connector 111. In one embodiment, board 131 is a small printed circuit board and connector 111 includes gold fingers that are adapted to be plugged into a RIMM socket, such as for example connector 109 on board 129. Thus, in one embodiment, when connector 111 of board 131 is engaged with or plugged into connector 109, memory controller 107 is coupled to memory translator 115. In one embodiment, memory translator 115 is an Intel® 82805AA Memory Translator, or the like. In one embodiment, serial memory signals are transmitted between memory controller 107 and memory translator 115 through the connector is 109 and 111 when board 131 is plugged into connector 109. In one embodiment, the serial memory signals transmitted between memory controller 107 and memory translator 115 include Rambus channel signals, or the like.

As will be discussed, in one embodiment, memory translator 115 provides support for parallel memory circuitry, such as for example SDRAMs, to be coupled to memory controller 107. As shown in FIG. 1, one embodiment of board 131 also includes clock buffers 113 coupled to memory translator 115 as well as a connector 117 and a connector 119. In one embodiment, connectors 117 and 119 are designed to support parallel memory circuitry such as for example DIMMs, or in one embodiment, SIMMs. In one embodiment, clock signals used to clock the parallel memory circuitry to be plugged into connectors 117 and 119 are provided by clock buffers 113.

In one embodiment, a circuit board 133 includes a connector 121, which is adapted to be engaged with connector 117. In one embodiment, board 133 includes parallel memory circuitry 125, which is coupled to connector 121. In one embodiment, a circuit board 135 includes a connector 123, which is adapted to be engaged with connector 119. In one embodiment, board 135 includes parallel memory circuitry 127, which is coupled to connector 123. In one embodiment, parallel memory circuitry 125 and 127 are SDRAMs and boards 133 and 135 are DIMMs. In one embodiment, boards 133 and 135 are SIMMs. In one embodiment, when boards 133 and 135 are plugged into board 131, parallel memory signals are transmitted to and from memory translator 115 through connectors 117, 121, 119 and 123. In addition, clock signals are transmitted to parallel memory circuitry 125 and 127 from clock buffers 113 through connectors 117, 121, 119 and 123.

Thus, one embodiment the present invention enables the utilization of SDRAMs with memory controllers designed to support only serial memory such as RIMMs. In one embodiment, circuit board 131 is adapted to be removed from connector 109 of motherboard 129, and can optionally be replaced with a serial memory circuitry such as for example an ordinary RIMM. Thus, in one embodiment, circuit board 131 of the present invention provides increased flexibility because the same motherboard 129, which is designed to support serial memory only, can now support both serial memory circuitry (e.g. RDRAMs) as well as parallel memory circuitry (SDRAMs).

Figure 2:
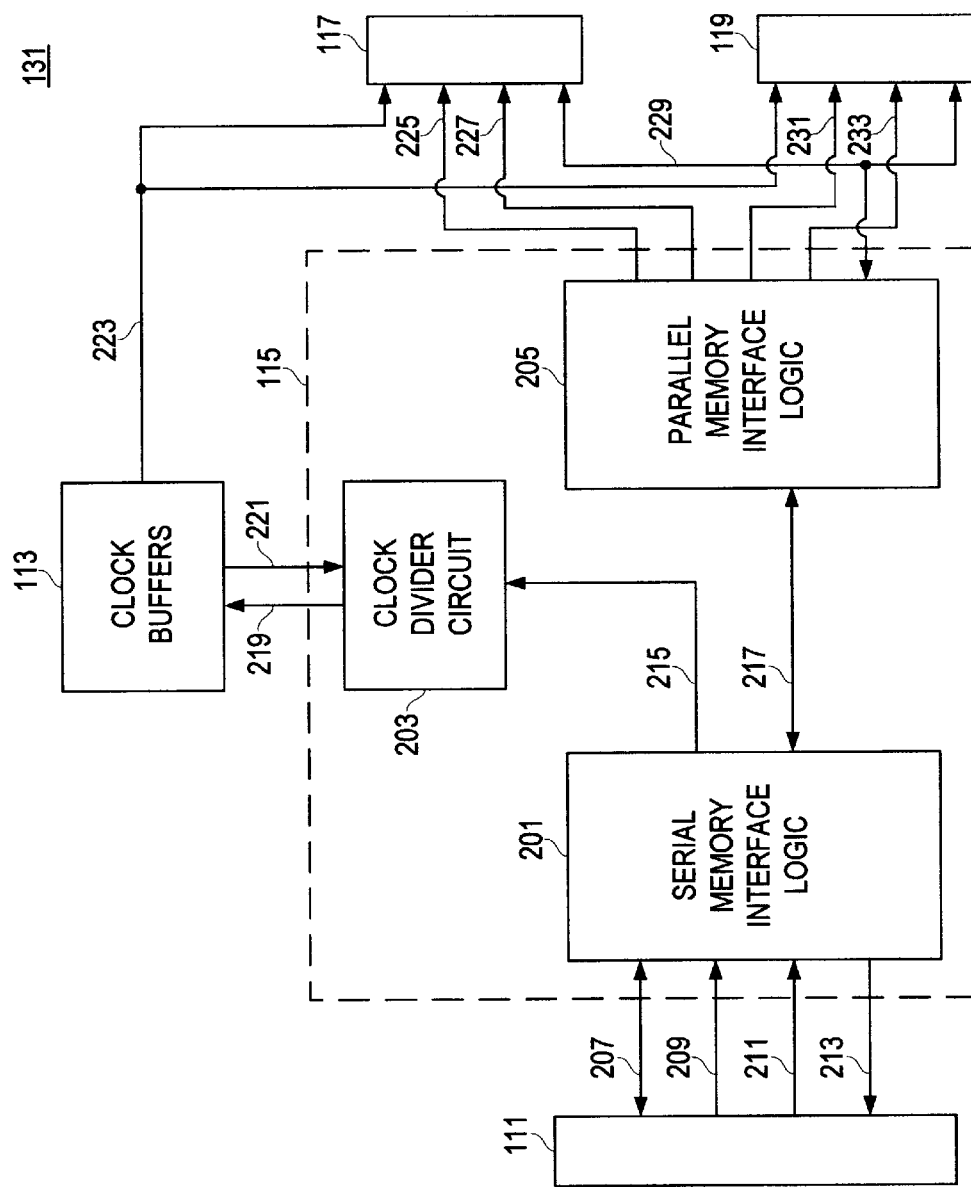
FIG. 2 is a block diagram illustrating one embodiment of a circuit board including circuitry to coupled parallel memory circuitry to a computer system configured to operate with serial memory circuitry.

FIG. 2 is an illustration showing increased detail of one embodiment of the block diagram of board 131 in accordance with the teachings of the present invention. As illustrated in the depicted embodiment, memory translator 115 includes serial memory interface logic 201 coupled to parallel memory interface logic 205 through link 217. In one embodiment, a clock divider circuit 203 is included in memory translator 115, and is coupled to receive a clock signal 215 from serial memory interface logic 201.

As illustrated in FIG. 2, a plurality of signals are transmitted to and from serial memory interface logic 201 through connector 111. In one embodiment, the plurality of signals transmitted to and from serial memory interface logic 201 through connector 111 are serial memory signals, such as for example those found in a Rambus channel. For instance, in one embodiment, the serial memory signals include data signals 207, control signals 209, inbound clock signals 211 and outbound clock signals 213. In one embodiment, data signals 207 include data signals that represent a data channel that is 18 bits (two bytes plus parity) wide.

In one embodiment, data is transmitted through the serial memory signals data rate of up to 1.6 gigabytes per second. In one embodiment, in order to help facilitate this high data transfer rate, the data channel for the data signals is impedance matched and terminated at approximately 28 ohms to reduce reflections. Indeed, in one embodiment, the electrical delay through the serial memory data channel is greater than the data bus cycle time.

In one embodiment, control signals 209 include control signals such as for example Rambus request control signals for memory accesses. In one embodiment, memory accesses include memory reads and memory writes. In one embodiment, the inbound clock signals 211 include a differential pair of clock signals transmitted from memory controller 107 of FIG. 1. In one embodiment, outbound clock signals 213 include a differential pair of clock signals transmitted to memory controller 107 of FIG. 1.

In one embodiment, serial memory interface logic 201 includes a Rambus application specific integrated circuit (ASIC) cell (RAC), which is designed to interface with a serial memory devices, such as for example RDRAMs, using a Rambus signaling level (RSL) signal. It is appreciated that other serial memory interfaces can also be utilized in accordance with the teachings of the present invention.

In one embodiment, clock signal 215 is generated in response to clock signals 211. In one embodiment, clock signals 211 have a frequency of 400 MHz. In one embodiment, clock signal 215 has a frequency of 400 MHz and is coupled to be received by clock divider circuit 203. In one embodiment, clock divider circuit 203 divides clock signal 215 by 4 to generate a clock signal 219 having a frequency of 100 MHz, which is coupled to be received by clock buffers 113. In one embodiment, clock buffers generates a plurality of clock signals 223, which are coupled to be received by connector 117 and connector 119. In one embodiment, four clock signals 223 are coupled to be received by connector 117 and four clock signals 223 are coupled to be received by connector 119. It is appreciated that with the plurality of clock signals 223 received by connectors 117 and 119, and increased number of SDRAM chips may be supported in accordance with teachings of present invention. In one embodiment, clock signals 223 have a frequency of 100 MHz. It is appreciated that other frequencies may be utilized in accordance with the teachings of the present invention.

In one embodiment, clock buffers 113 also generates a feedback clock signal 221 which is coupled to the received by clock divider circuit 203. In one embodiment, clock divider circuit 203 includes synchronization circuitry coupled to receive feedback clock signal 221 to help synchronize clock signals 223 with clock signal 219 and clock signals 211. In one embodiment, the synchronization circuitry of clock divider circuit 203 includes known delayed locked loop (DLL) circuitry, or phase locked loop (PLL) circuitry or the like.

As illustrated in FIG. 2, a plurality of signals are transmitted to and from parallel memory interface logic 205 and connectors 117 and 119. In one embodiment, the plurality of signals transmitted to and from serial memory interface logic 205 and connectors 117 and 119 are parallel memory signals, such as for example those compatible with SDRAMs. For instance, in one embodiment, the parallel memory signals include data signals 229, control signals 225 and 231 and address signals 227 and 233. In one embodiment, data signals 229 include data signals that represent a data channel that is 72 bits (eight bytes plus parity) wide, which is coupled to be received by connectors 117 and 119.

In one embodiment, data is transmitted through the parallel memory signals data rate of up to 800 megabytes per second. In one embodiment, the control signals include control signals 225, which are coupled to connector 117 and control signals 231, which are coupled to connector 119. In one embodiment, the control signals include for example row address select (RAS) signals, column address signals (CAS), write enable signals and the like. In one embodiment, the address signals include address signals 227, which are coupled to connector 117 and address signals 233, which are coupled to connector 119. In one embodiment, address signals 227 include bank A address signals and address signals 233 include bank B address signals.

In one embodiment, the parallel memory interface logic 205 includes encoding/decoding or multiplexing/demultiplexing circuitry to translate the serial memory data signals into parallel data signals. As mentioned above, in one embodiment, the serial memory data signals include a data channel 18 bits wide while the parallel memory data signals include eight data channel 72 bits wide. Thus, in one embodiment, the multiplexing/demultiplexing circuitry of parallel memory interface logic 205 decodes the narrower width 18 bit wide data channel of the serial memory data signals into the wider width 72 bit wide data channel of the parallel memory data signals and vice versa.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An apparatus, comprising:
    a first circuit board;
    a memory translator circuit on the first circuit board, having serial memory interface logic to be coupled to a serial memory controller circuit on a second board, having parallel interface logic to be coupled to parallel memory circuitry on a third circuit board; and
    a clock buffer circuit on the first circuit board, coupled to the memory translator circuit, the clock buffer circuit coupled to generate a plurality of clock signals to be coupled to the parallel memory circuitry on the third circuit board.

2. The apparatus of claim 1 further comprising a serial memory connector on the first circuit board coupled to the serial memory interface logic, the serial memory connector adapted to coupled to the second board.

3. The apparatus of claim 1 further comprising a first parallel memory connector on the first circuit board coupled to the parallel memory interface logic, the first parallel memory connector adapted to be coupled to the third board.

4. The apparatus of claim 3 further comprising a second parallel memory connector on the first circuit board coupled to the parallel memory interface logic and the clock buffer circuit, the second parallel memory connector adapted to be coupled to parallel memory circuitry on a third circuit board.

5. The apparatus of claim 1 wherein the clock buffer circuit generates a plurality of clock signals coupled to be received by the parallel memory circuitry.

6. The apparatus of claim 1 wherein the memory translator circuit includes a clock divider circuit coupled to receive a first clock signal from the serial memory interface logic, the clock divider to generate a second clock signal coupled to be received by the clock buffer circuit.

7. The apparatus of claim 6 wherein the second clock signal has a frequency less than a frequency of the first clock signal.

8. The apparatus of claim 6 wherein the memory translator includes synchronization circuitry coupled to receive a clock feedback signal from the clock buffer circuit, the second clock signal coupled to be adjusted in response to the clock feedback signal.

9. The apparatus of claim 1 wherein the serial memory interface logic is coupled to transmit and receive signals adapted to be coupled to Rambus Dynamic Random Access Memory (RDRAM) circuitry.

10. The apparatus of claim 1 wherein the parallel memory interface logic is coupled to transmit and receive signals adapted to be coupled to Synchronous Dynamic Random Access Memory (SDRAM) circuitry.

11. The apparatus of claim 1 wherein the parallel memory interface logic includes multiplexing/demultiplexing circuitry to convert serial signals coupled to be transmitted to and from the serial memory interface logic to parallel signals coupled to be transmitted to and from the parallel memory interface logic.

12. The apparatus of claim 1 wherein a first plurality of data signals are coupled to transmitted to and from the serial memory interface logic, wherein a second plurality signals are coupled be transmitted to and from the parallel memory interface logic, wherein a number of the second plurality of data signals is greater than a number of the first plurality of data signals.

13. A method, comprising:
    receiving on a first board serial memory signals and a first clock signal generated from a serial memory controller circuit on a second board;
    translating the serial memory signals received from the second board into parallel memory signals;
    generating a plurality of second clock signals in response to the first clock signal, each one of the second plurality of clock signals having a frequency less than a frequency of the first clock signal; and
    transmitting the parallel memory signals translated from the serial memory signals to parallel memory circuitry on a third board.

14. The method of claim 13 further comprising:
    receiving on the first board parallel memory signals from the parallel memory circuitry on the third board;
    translating the parallel memory signals received from the third board into serial memory signals; and
    transmitting the serial memory signals translated from the parallel memory signals received from the third board to the serial memory controller circuit on the second board.

15. The method of claim 13 wherein generating the plurality of second clock signals comprises:
    dividing the first clock signal with a clock divider circuit; and
    coupling an output of the clock divider circuit to a plurality of buffers to generate the plurality of second clock signals.

16. The method of claim 15 further comprising synchronizing the first and second clock signals in response to a feedback signal generated by one of the plurality of buffers.

17. The method of claim 13 wherein the serial memory signals comprise signals compatible with Rambus Dynamic Random Access Memory (RDRAM).

18. The method of claim 17 further comprising coupling the first board to the second board through a Rambus In-Line Memory Module (RIMM) connector.

19. The method of claim 13 wherein the parallel memory signals comprise signals compatible with Synchronous Dynamic Random Access Memory (SDRAM).

20. The method of claim 19 further comprising coupling the third board to the first board through a Single In-Line Memory Module (SIMM) connector.

21. The method of claim 19 further comprising coupling the third board to the first board through a Dual In-Line Memory Module (DIMM) connector.

22. A system, comprising:

a processor;

a bus coupled to the processor;

a serial memory controller circuit coupled to the bus;

a second board including the processor, the bus and the memory controller circuit;

a first board coupled to the second board through a serial memory module connector;

a memory translator circuit on the first board coupled to the serial memory controller through the serial memory module connector; and parallel memory circuitry coupled to the memory translator circuit, the memory translator circuit coupled to translate memory signals between the parallel memory circuitry and the serial memory controller circuit.

23. The system of claim 22 further comprising a clock buffer circuit coupled to generate a plurality of second clock signals to be received by the parallel memory circuitry, the plurality of second clock signals generated in response to a first clock signal generated by the serial memory controller circuit.

24. The system of claim 23 further comprising synchronization circuitry coupled to receive a feedback signal from the clock buffer circuit to synchronize the first clock signal and the plurality of second clock signals.

25. The system of claim 22 wherein the parallel memory circuitry comprises Synchronous Dynamic Random Access Memory (SDRAM).

26. The system of claim 22 wherein the serial memory module connector is adapted to be coupled to a Rambus In-Line Memory Module (RIMM).

27. The system of claim 22 wherein a bit width of parallel data memory signals generated by the memory translator circuit is greater than a bit width of serial memory signals generated by the serial memory controller circuit.

* * * * *